(12) United States Patent
Sheen et al.

(10) Patent No.: US 7,655,534 B2
(45) Date of Patent: Feb. 2, 2010

(54) METHOD OF FORMING FIN TRANSISTOR

(75) Inventors: Dong Sun Sheen, Kyoungki-do (KR); Seok Pyo Song, Seoul (KR); Sang Tae Ahn, Kyoungki-do (KR); Hyun Chul Sohn, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 448 days.

(21) Appl. No.: 11/594,579

(22) Filed: Nov. 8, 2006

(65) Prior Publication Data

US 2007/0148840 A1    Jun. 28, 2007

(30) Foreign Application Priority Data

Dec. 23, 2005    (KR) .................... 10-2005-0128607

(51) Int. Cl.
*H01L 21/762* (2006.01)

(52) U.S. Cl. .................. 438/435; 438/296; 257/506; 257/E21.546

(58) Field of Classification Search .............. 438/435, 438/296; 257/506, 321, E21.546, E21.41
See application file for complete search history.

(56) References Cited

U.S. PATENT DOCUMENTS 6,960,781 B2 * 11/2005 Currie et al. .................. 257/19
7,118,987 B2 * 10/2006 Fu et al. ...................... 438/435
2002/0127817 A1 * 9/2002 Heo et al. .................... 438/424
2002/0171107 A1 * 11/2002 Cheng et al. ................ 257/347
2005/0170604 A1 * 8/2005 Orlowski et al. ............ 438/404
2005/0184356 A1 * 8/2005 Cheng et al. ................ 257/520
2005/0218438 A1 * 10/2005 Lindert et al. ............... 257/296
2007/0072387 A1 * 3/2007 Lai et al. ..................... 438/424

FOREIGN PATENT DOCUMENTS

KR    10-2005-0011952    1/2005

OTHER PUBLICATIONS

Korean Patent Gazette, May 7, 2007.

* cited by examiner

*Primary Examiner*—Steven J Fulk
(74) *Attorney, Agent, or Firm*—Ladas & Parry LLP (57) ABSTRACT

A fin transistor is formed by forming a hard mask layer on a substrate having an active region and a field region. The hard mask layer is etched to expose the field region. A trench is formed by etching the exposed field region. The trench is filled with an SOG layer. The hard mask layer is removed to expose the active region. An epi-silicon layer is formed on the exposed active region. The SOG layer is then partially etched from the upper end of the trench, thus filling a lower portion of the trench. A HDP oxide layer is deposited on the etched SOG layer filling the trench, thereby forming a field oxide layer composed of the SOG layer and the HDP oxide. The HDP oxide layer in the field oxide layer is etched to expose both side surfaces of the epi-silicon layer. A gate is then formed on the epi-silicon layer of which both side surfaces are exposed and the field oxide layer.

14 Claims, 7 Drawing Sheets

METHOD OF FORMING FIN TRANSISTOR

BACKGROUND OF THE INVENTION

1. Field of the Invention

The present invention relates to a method of manufacturing a semiconductor device, and more particularly to a method of forming a fin transistor, which is constructed to improve performance and yield in a semiconductor device.

2. Description of the Related Art

The design rule calling for increasingly shrinking semiconductor memory device in terms of size means that the channel length and the channel width of a transistor formed therein must decrease while both the doping concentration of the junction regions and the junction leakage current increase due to formation of high electric field. This causes difficulty in obtaining a required threshold voltage when a conventional transistor, which has a two-dimensional planar channel structure, is used in a highly integrated semiconductor device. This also causes limitations in improving the refresh characteristics.

In response to these problems, some known researches produced a transistor, which has a three-dimensional channel structure capable of increasing a channel length, known as the "fin transistor" having a three-dimensional channel structure.

In forming a fin transistor, a field oxide layer (which exists in a field region) is entirely or partially etched to expose an active region. Hence, as the active region projects, the fin transistor has a three-dimensional channel structure, whereby it is possible to improve current drive characteristic. As a consequence, the fin transistor has drawn attention as it may be an ideal structure for realizing a next generation ultra high integration device. In particular, the fin transistor is considered to have an advantage in increasing a refresh time interval in a memory device.

Meanwhile, as the degree of integration of a device increases, it has been difficult to form a field oxide layer for isolating active regions from one another. Specifically, as the gap between field regions is narrowed, it has been difficult to fill a trench with an insulation layer. Therefore, instead of solely using a high density plasma (HDP) oxide layer as an insulation layer for filling a trench, a laminate of a spin on glass (SOG) layer and an HDP oxide layer is advantageously used for filling a trench. That is to say, when filling a trench, the lower portion of the trench is filled by the SOG layer, and the upper portion of the trench is filled by the HDP oxide layer. In this method, the trench can be easily filled irrespective of the depth of the trench.

However, when etching the field oxide layer to project the active region, a problem is caused in that, since the SOG layer having a high etch rate with respect to an etching solution is exposed, the side surfaces of the exposed SOG layer are etched in a subsequent washing process. If the side surfaces of the SOG layer are etched, because a polysilicon layer serving as a gate wiring material is not removed from but remains on the side walls of the etched SOG layer, shorts can be caused between gates and between gate lines and bit lines, whereby yield is decreased in the manufacture of a semiconductor device. Also, due to the presence of a parasitic capacitance, device characteristic can be deteriorated such as the reduction of the driving speed of the device.

SUMMARY OF THE INVENTION

Accordingly, the present invention has been made in an effort to solve the problems occurring in the related art, and an object of the present invention is to provide a method of forming a fin transistor which can prevent undesired etching of an SOG layer.

Another object of the present invention is to provide a method of forming a fin transistor which can improve performance and yield in a semiconductor device by preventing undesired etching of an SOG layer.

In order to achieve the above object, according to one aspect of the present invention, there is provided a method of forming a fin transistor, comprising the steps of forming a hard mask layer on a silicon substrate having an active region and a field region, wherein the hard mask layer exposes the field region of the substrate; forming a trench by etching the exposed field region of the substrate; filling the trench with an SOG layer; exposing the active region of the substrate by removing the hard mask layer; forming an epi-silicon layer on the exposed active region of the substrate; partially etching the SOG layer so that only a lower portion of the trench is filled with the SOG layer; depositing an HDP oxide layer on the etched SOG layer inside the trench, thereby forming a field oxide layer comprised of the SOG layer and the HDP oxide layer; etching the HDP oxide layer of the field oxide layer to expose both side surfaces of the epi-silicon layer; and forming a gate on the epi-silicon layer of which both side surfaces are exposed and the field oxide.

According to another aspect of the present invention, the hard mask layer comprises a laminate of a pad oxide layer and a pad nitride layer.

According to another aspect of the present invention, the hard mask layer is formed in a thickness of 300~1,000 Å.

According to another aspect of the present invention, the step of forming an epi-silicon layer is implemented at a temperature of in the range of 600~1,000° C. in a furnace.

According to another aspect of the present invention, the epi-silicon layer is formed using one of $SiH_4$, $Si_2H_6$ and $SiCl_2H_2$ as a source gas.

According to another aspect of the present invention, the epi-silicon layer is formed by doping impurities of Ge or P.

According to another aspect of the present invention, the epi-silicon layer is formed by sequentially laminating Si and SiGe or by alternately laminating Si and SiGe at least two times until obtaining a predetermined thickness.

According to another aspect of the present invention, the epi-silicon layer is formed to a thickness which is 90~110 Å less than the thickness of the hard mask layer.

According to another aspect of the present invention, the SOG layer is etched to a depth of 150~200 Å when measured from an upper end of the trench.

According to another aspect of the present invention, the method further comprises the step of performing a heat treatment after etching the SOG layer and before forming the HDP oxide layer, for densification of the SOG layer.

According to another aspect of the present invention, the heat treatment is conducted at a temperature in the range of 600~1,000° C. in a furnace under an $N_2$ environment.

According to still another aspect of the present invention, the method further comprises the step of performing a heat treatment after forming the HDP oxide layer, for densification of the HDP layer.

According to yet still another aspect of the present invention, the heat treatment is conducted at a temperature in the range of 700~1,000° C. in a furnace under an $N_2$ or $O_2$ environment.

BRIEF DESCRIPTION OF THE DRAWINGS

The above objects, and other features and advantages of the present invention will become more apparent after a reading of the following detailed description when taken in conjunction with the drawings, in which.

DETAILED DESCRIPTION OF PREFERRED EMBODIMENTS

Reference will now be made in greater detail to a preferred embodiment of the invention, an example of which is illustrated in the accompanying drawings. Wherever possible, the same reference numerals will be used throughout the drawings and the description to refer to the same or like parts.

Figure 1:
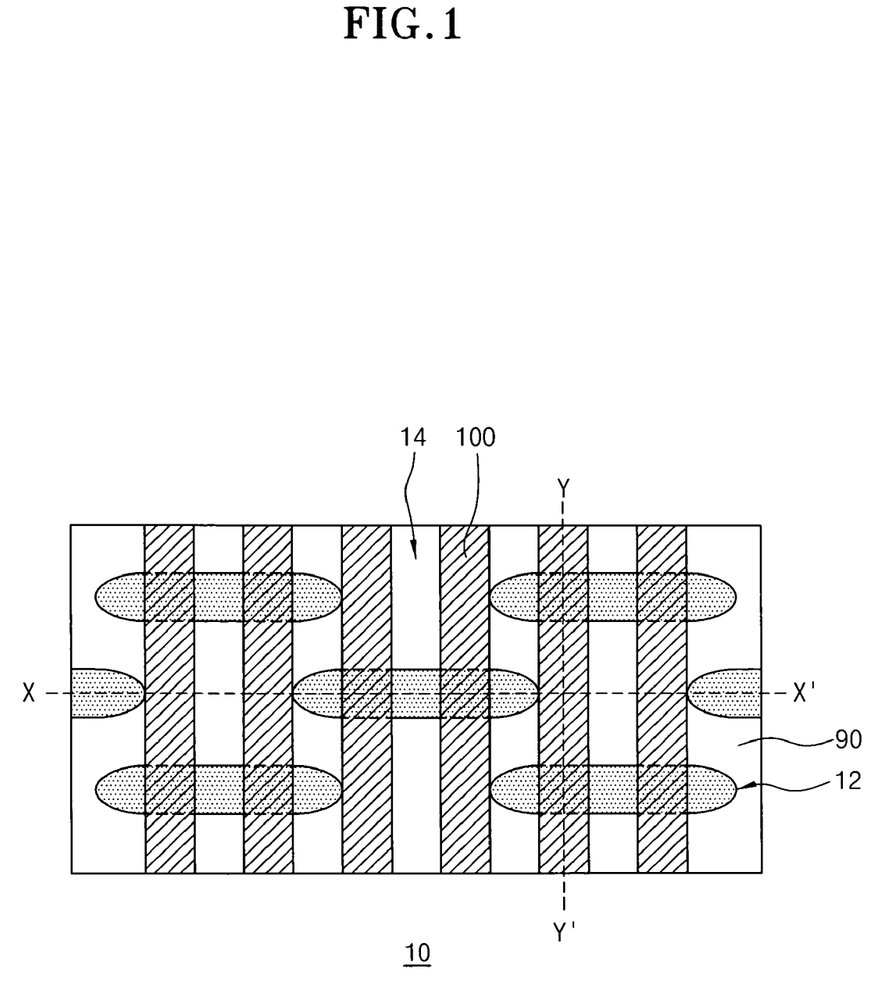
FIG. 1 is a plan view for explaining a method of forming a fin transistor in accordance with an embodiment of the present invention.

FIG. 1 is a plan view for explaining a method of forming a fin transistor in accordance with an embodiment of the present invention.

As illustrated in FIG. 1, a silicon substrate 10 has a plurality of active regions 12 and a field region 14 defining the active regions 12. A field oxide layer 90 is formed in the field region 14. The gate 100 is formed to dispose on the active region 12 and the field oxide layer 90.

FIGS. 2A-2F are cross-sectional views taken along the lines X-X' in FIG. 1 to show each cross-sectional view corresponding to one or more selected process steps. Similarly, FIGS. 3A-3F are cross-sectional views taken along the line Y-Y' in FIG. 1 to show each cross-sectional view corresponding to one or more selected process steps.

Figure 2A:
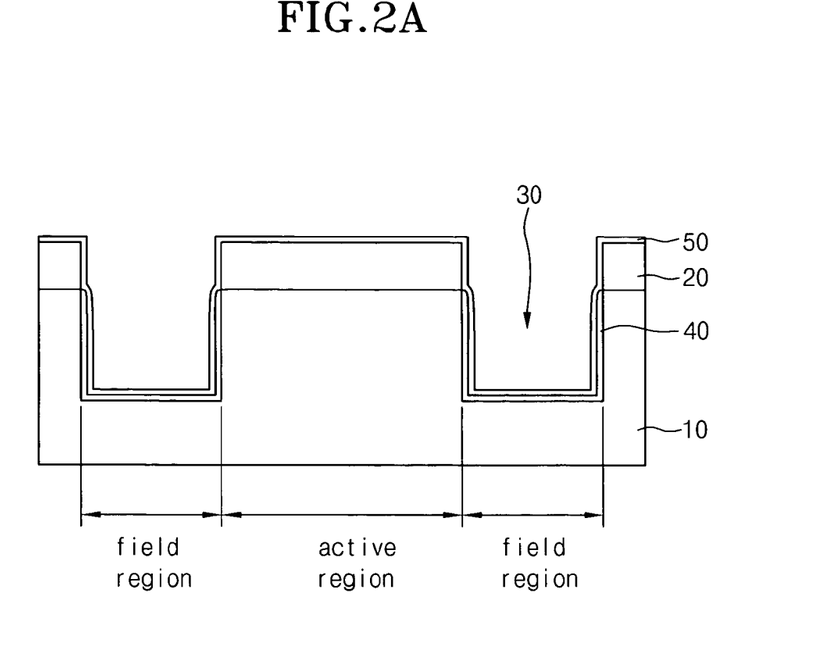
FIGS. 2A through 2F are cross-sectional views taken along the line X-X' of FIG. 1, illustrating processes of the method.
Figure 3A:
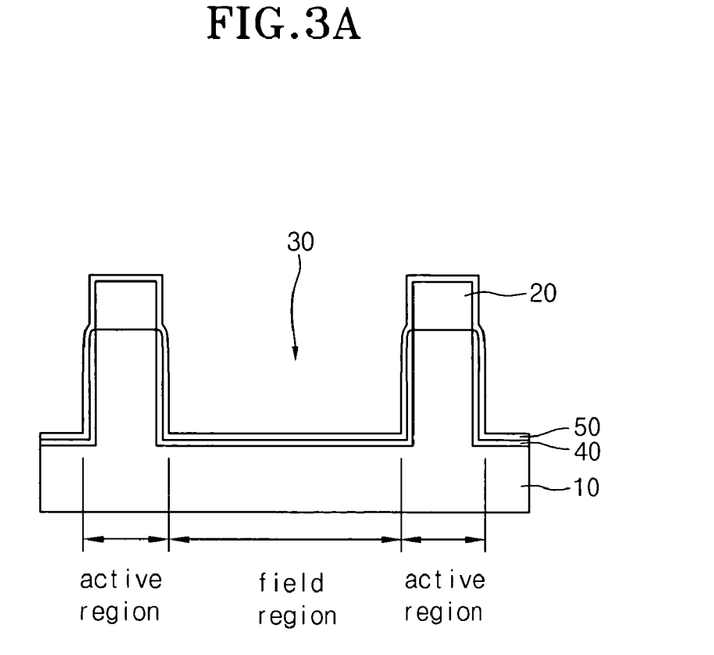
FIGS. 3A through 3F are cross-sectional views taken along the line Y-Y' of FIG. 1, illustrating the processes of the method together with FIGS. 2A through 2F.

Referring to FIGS. 2A and 3A, a hard mask layer 20 is formed to a thickness in the range of 300~1,000 Å on a silicon substrate 10 having a plurality of active regions and a field region defining the active regions. The hard mask layer 20 comprises a laminate of pad oxide layer and a pad nitride layer. Then, after the field region of the substrate 10 is exposed by etching the hard mask layer 20, the exposed field region of the substrate 10 is etched to form a trench 30. Next, a sidewall oxidization process is performed on the resultant substrate 10 having the trench 30, such that a sidewall oxide 40 is formed on the surface of the trench 30. Thereafter, a liner nitride layer 50 is deposited on the resultant substrate 10 which includes the sidewall oxide 40.

Figure 2B:
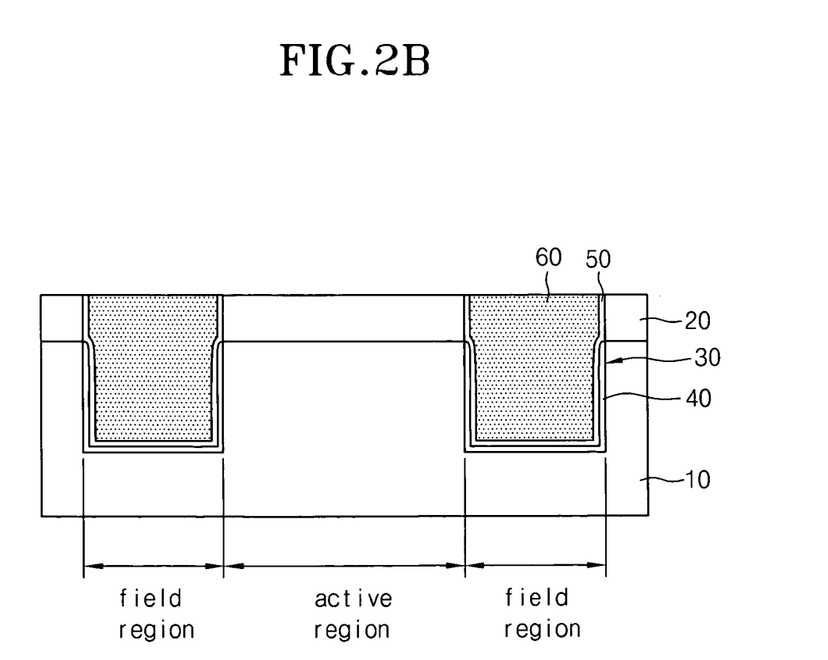
Figure 3B:
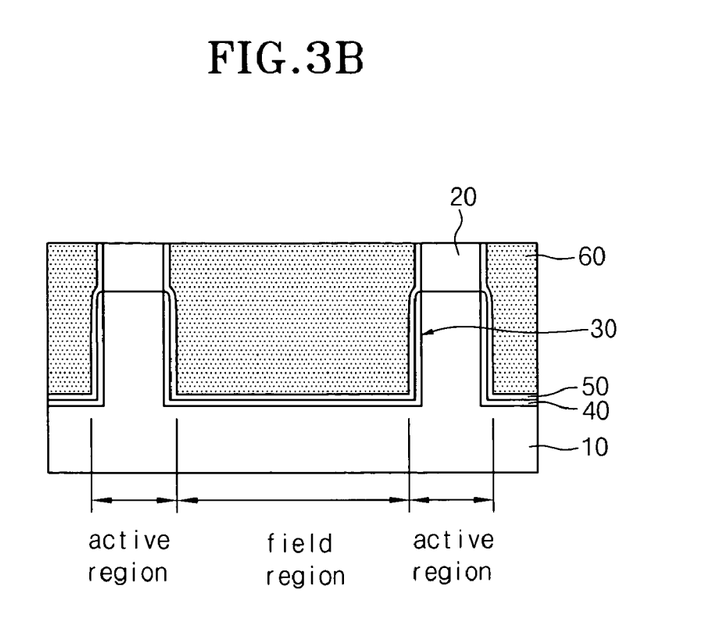

Referring to FIGS. 2B and 3B, a SOG layer 60 having excellent flowability is deposited on the liner nitride layer 50 to fill the trench 30. Then, a chemical mechanical polishing (CMP) process is performed to remove the SOG layer 60 and the liner nitride layer 50 until the hard mask layer 20 is exposed. Here, the SOG layer 60 is formed by spin coating an SOG solution, baking the SOG solution to discharge solvent from the SOG solution, and then heat treating to cure the baked SOG solution in a furnace at a temperature in the range of 300~700° C. Since the trench 30 is filled using the SOG layer 60 having excellent flowability, void-free filling-up characteristic can be accomplished.

Figure 2C:
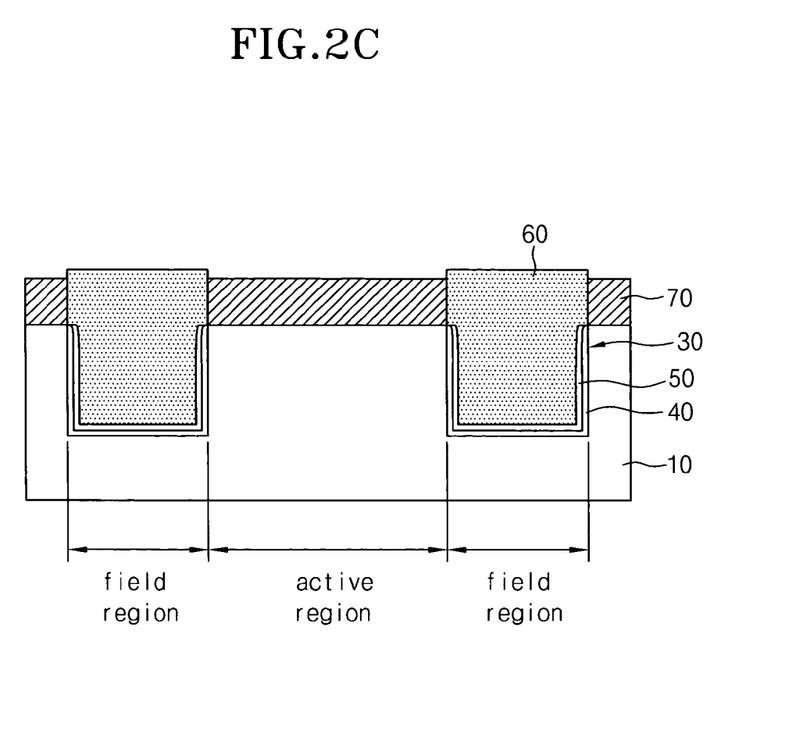
Figure 3C:
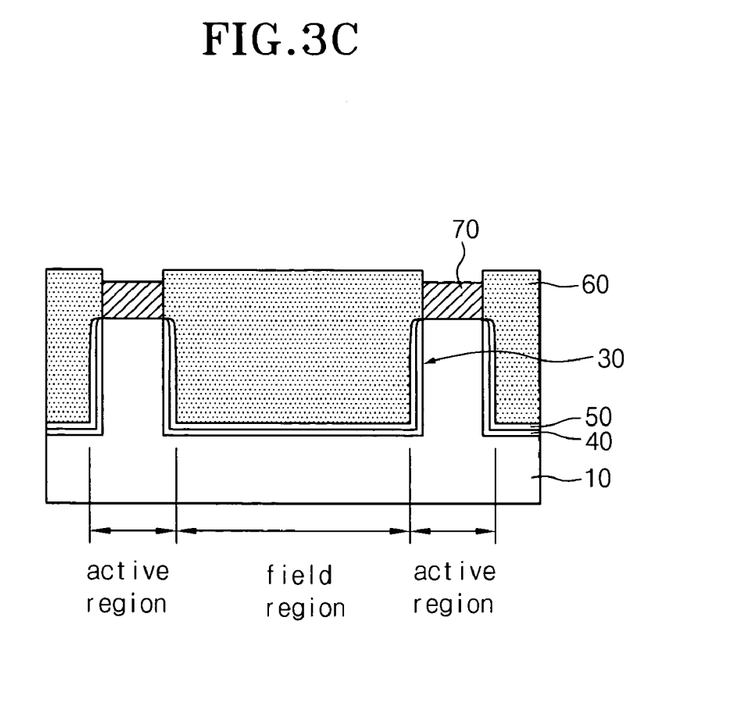

Referring to FIGS. 2C and 3C, the hard mask layer 20 and the liner nitride layer 50 are removed to expose the active region of the substrate 10. Thereupon, an epi-silicon layer 70 is formed on the exposed active region of the substrate 10 by a selective epitaxial growth (SEG) process. The SEG process is conducted in a furnace at a temperature in the range of 600~1,000° C. using one of $SiH_4$, $Si_2H_6$ and $SiCl_2H_2$ as a source gas.

The epi-silicon layer 70 doped with impurities, for example, Ge or P is formed to have a thickness, which is 90~110 Å less than the thickness of the hard mask layer 20. The epi-silicon layer 70 is formed by sequentially laminating Si and SiGe or by alternately laminating Si and SiGe at least two times until obtaining a predetermined thickness. Here, according to an embodiment of the present invention, due to the fact that the epi-silicon layer 70 is selectively formed on the active region of the substrate 10, when subsequently etching a field oxide layer for exposing both side surfaces of the epi-silicon layer 70, the SOG layer 60 is prevented from being exposed. As a consequence, it is possible to prevent the side surfaces of the SOG layer 60 from being etched when subsequently cleaning. Therefore, the problems associated with the conventional art caused by the etching of the side surfaces of the SOG layer are solved in the present invention.

Also, in the present invention, since the impurities are doped when forming the epi-silicon layer 70, the mobility of a channel carrier can be increased, such that it is capable of improving in the operational performance of a transistor.

Figure 2D:
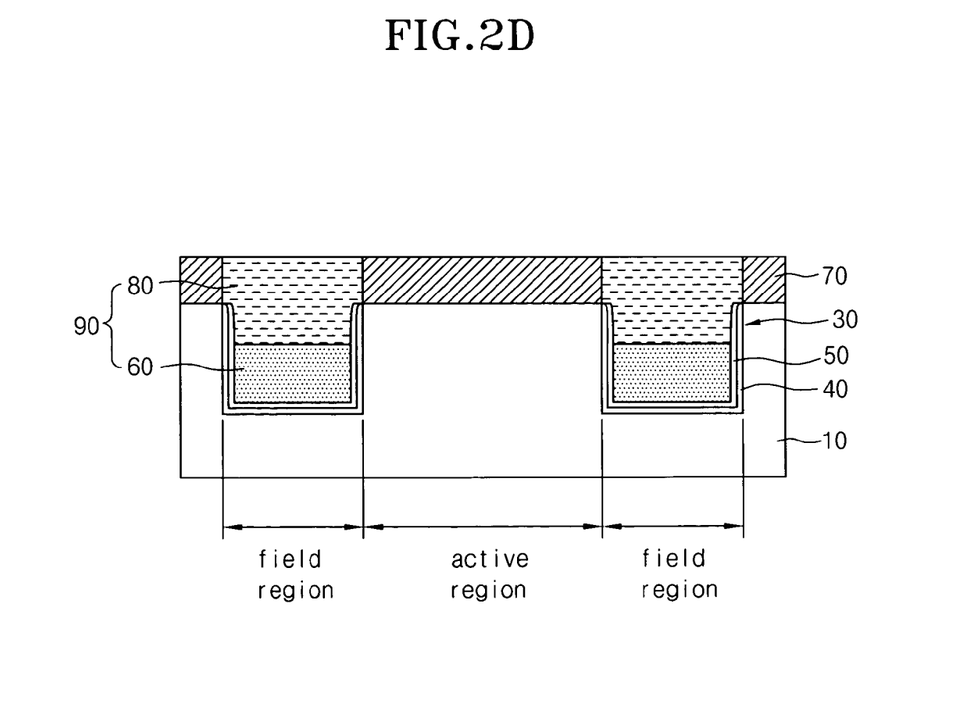
Figure 3D:
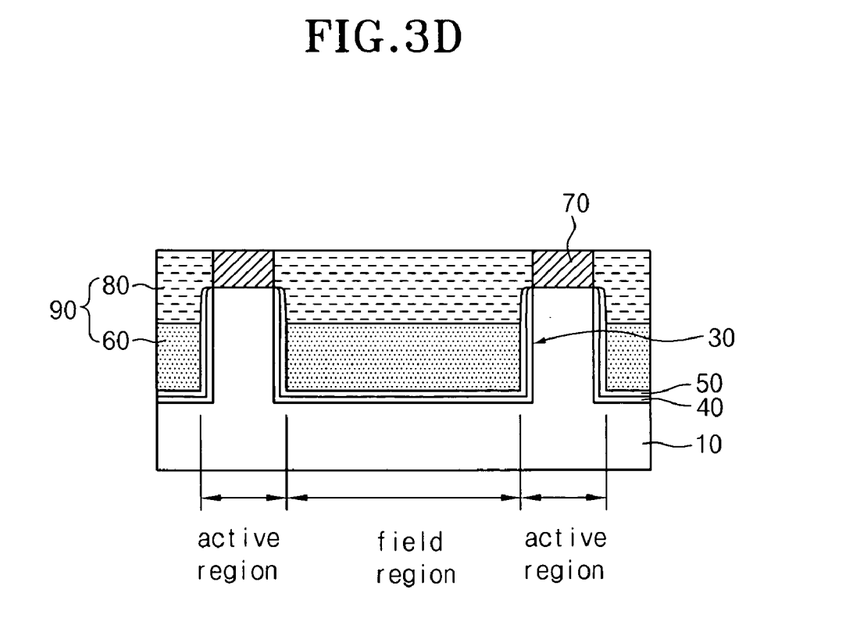

Referring to FIGS. 2D and 3D, the SOG layer 60 in the trench 30 is partially etched to a depth of 150~200 Å when measured from the upper end of the trench 30 using a hydrofluoric acid (HF) solution. Then, a heat treatment is performed for the resultant substrate 10 having the etched SOG layer 60 at a temperature in the range of 600~1,000° C. in a furnace under an $N_2$ environment for densification of the SOG layer 60. Next, after an HDP oxide layer 80 is deposited to fill the partially etched SOG layer 60 in the trench 30 and on the epi-silicon layer 70, the HDP oxide layer 80 has undergone the CMP process until the epi-silicon layer 70 is exposed, whereby the field oxide layer 90 comprised of the SOG layer 60 and the HDP oxide layer 80 is formed inside the trench 30. Here, in the present invention, due to the fact that the lower portion of the trench 30 is filled with the SOG layer 60 having an excellent flowability characteristics, and the upper portion of the trench 30 is filled with the HDP oxide layer 80, it is possible to form the void-free field oxide layer 90 irrespective of the depth of the trench 30.

Meanwhile, it is preferred that, after the HDP oxide layer 80 is formed, a heat treatment is performed on the resultant substrate 10 for densification of the HDP oxide layer 80. The heat treatment is conducted at a temperature of 700~1,000° C. in a furnace under an $N_2$ or $O_2$ environment.

Figure 2E:
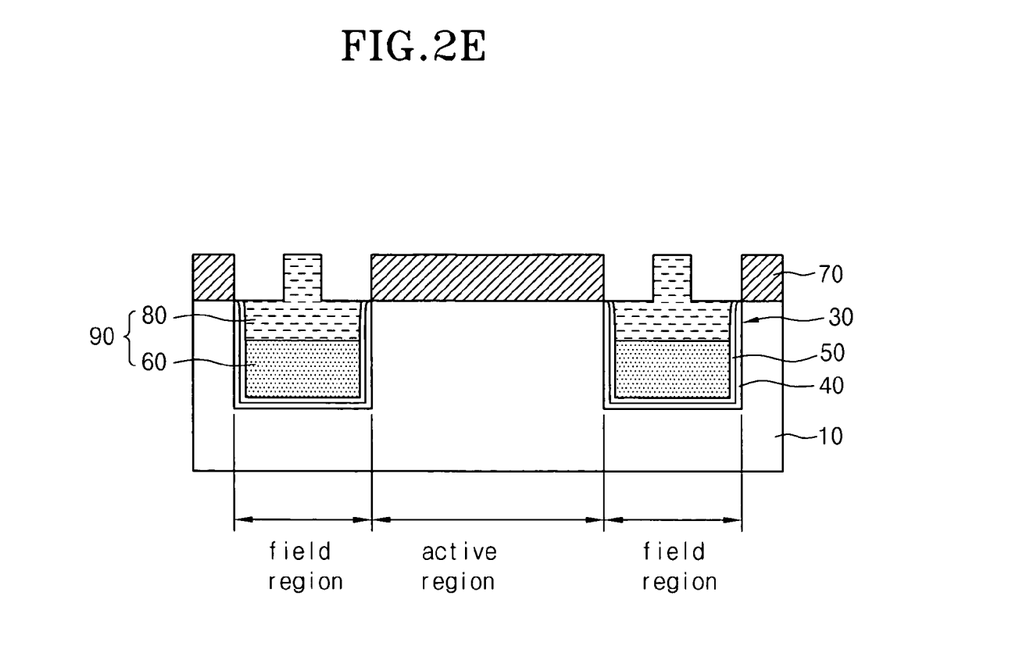
Figure 3E:
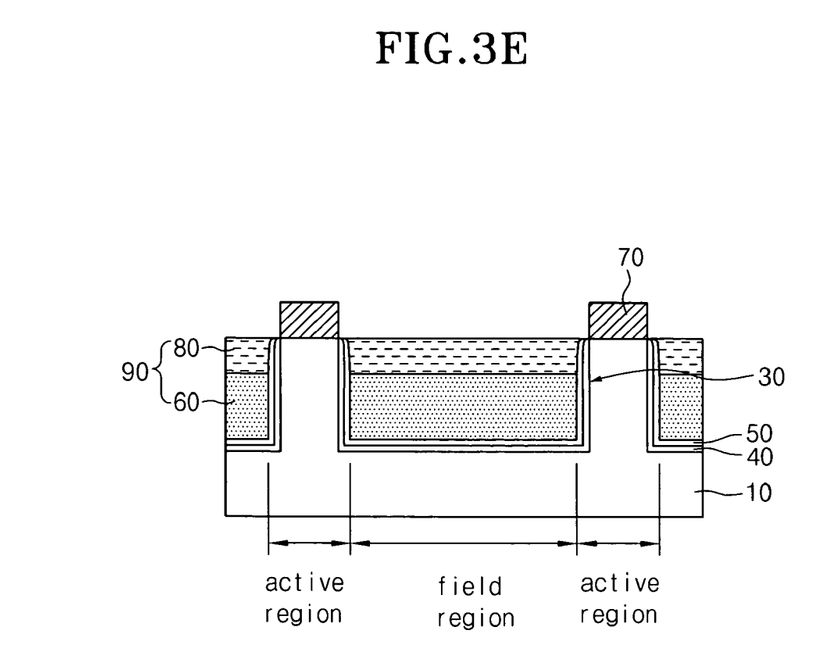

Referring to FIGS. 2E and 3E, the HDP oxide layer 80 of the field oxide layer 90 is etched such that both side surfaces of the epi-silicon layer 70 are exposed. However, the SOG layer 60 is not etched.

Because the epi-silicon layer 70 is formed on the active region of the substrate 10, the SOG layer 60 is prevented from being exposed when the field oxide layer 90 is etched to expose both side surfaces of the active region. Consequently, in the present invention, it is possible to prevent the SOG layer 60 from being etched in a subsequent cleaning process, as a result of which it is possible to prevent degradation of the device manufacturing yield and the device characteristics.

Figure 2F:
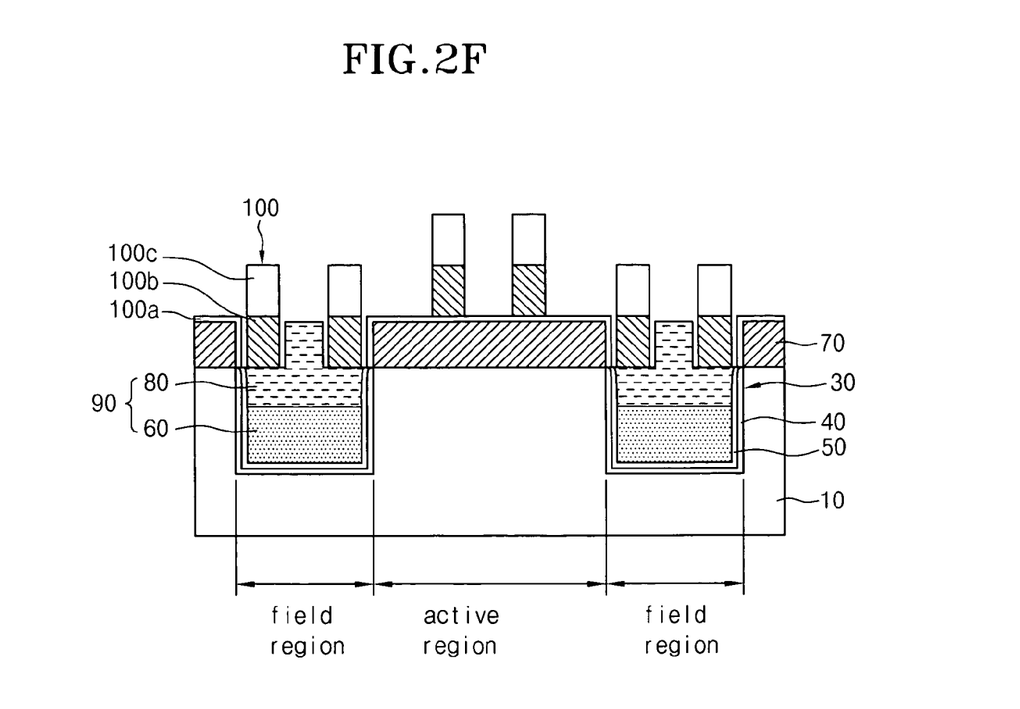
Figure 3F:
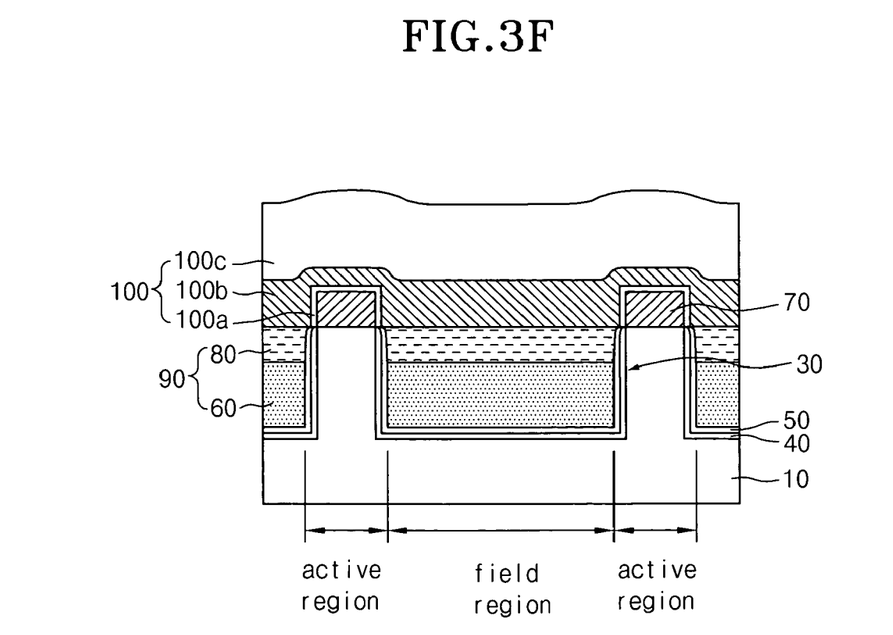

Referring to FIGS. 2F and 3F, after a gate insulation layer 100a, a gate conductive layer 100b, and a gate hard mask layer 100c are sequentially formed on the epi-silicon layer 70 with both side surfaces exposed and the field oxide layer 90, the hard mask layer 100c, the gate conductive layer 100b and the gate insulation layer 100a are etched to form a gate 100.

Then, while not shown in the drawings, a series of known processes including one for forming source/drain regions in the epi-silicon layer 70 at both sides of the gate 100 are subsequently and sequentially conducted to form a fin transistor according to the present invention.

As is apparent from the above descriptions, the method of forming a fin transistor according to the present invention provides advantages in that, since a field oxide layer 90 is formed using an SOG layer 60 and an HDP oxide layer 80, it is possible to form a void-free field oxide layer 90. Also, in the present invention, because a selective epi-silicon layer 70 is formed on the active region of a substrate 10, when etching the field oxide layer 90 to expose both side surfaces of the active region, the SOG layer 60 is prevented from being exposed and etched, whereby it is possible to prevent the SOG layer 60 from being etched in a subsequent cleaning process. Consequently, since a subsequent gate forming process can be reliably conducted, the device characteristics and the yield are improved. Further, in the present invention, because the impurities are doped when forming the epi-silicon layer 70, the strain of a channel region of the transistor can be adjusted, and mobility of a channel carrier can be increased, whereby the operational characteristic of the transistor can be improved.

As a result, in the present invention, the trench filling characteristic of a field region can be elevated, and the performance of the fin transistor and the yield of a semiconductor device can be improved. Further, it is possible to manufacture a further highly integrated semiconductor device which uses further fine patterns.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of forming a fin transistor in a semiconductor device comprising the steps of:
    forming a hard mask layer on a silicon substrate having an active region and a field region, wherein the hard mask layer exposes the field region;
    forming a trench by etching the exposed field region of the substrate;
    forming a liner nitride layer on surfaces of the trench;
    filling the trench having the liner nitride formed on surfaces thereof with an SOG layer, such that the SOG layer contacts the liner nitride layer formed on the surfaces of the trench;
    exposing the active region of the substrate by removing the hard mask layer;
    forming an epi-silicon layer on the exposed active region of the substrate;
    partially etching the SOG layer so that only a lower portion of the trench is filled with the SOG layer;
    depositing an HDP oxide layer on the etched SOG layer inside the trench having the liner nitride formed on surfaces thereof, thereby forming a field oxide layer comprised of the SOG layer and the HDP oxide layer;
    etching the HDP oxide layer of the field oxide layer to expose both side surfaces of the epi-silicon layer, wherein the etching the HDP oxide layer is implemented so as to not expose the SOG layer; and
    forming a gate on the epi-silicon layer of which both side surfaces are exposed and the field oxide.

2. The method of claim 1, wherein the hard mask layer comprises a laminate of a pad oxide layer and a pad nitride layer.

3. The method of claim 1, wherein the hard mask layer is formed to a thickness in the range of 300~1,000 Å.

4. The method of claim 1, wherein the step of forming an epi-silicon layer is implemented at a temperature in the range of 600~1,000°C. in a furnace.

5. The method of claim 1, wherein the epi-silicon layer is formed using one of $SiH_4$, $Si_2H_6$, and $SiCl_2H_2$ as a source gas.

6. The method of claim 1, wherein the epi-silicon layer is formed by doping impurities of Ge or P.

7. The method of claim 1, wherein the epi-silicon layer is formed by sequentially laminating Si and SiGe or by alternately laminating Si and SiGe at least two times until obtaining a predetermined thickness.

8. The method of claim 1, wherein the epi-silicon layer is formed to a thickness which is 90~110 Å less than the thickness of the hard mask layer.

9. The method of claim 1, wherein the SOG layer is etched to a depth of 150~200 Å when measured from the upper end of the trench.

10. The method of claim 1, further comprising the step of:
    performing a heat treatment after etching the SOG layer and before forming the HDP oxide layer, for densification of the SOG layer.

11. The method of claim 10, wherein the heat treatment is conducted at a temperature in the range of 600~1,000°C. in a furnace under an $N_2$ environment.

12. The method of claim 1, further comprising the step of:
    performing a heat treatment after forming the HDP oxide layer, for densification of the HDP layer.

13. The method of claim 12, wherein the heat treatment is performed at a temperature in the range of 700~1,000°C. in a furnace under an $N_2$ or $O_2$ environment.

14. The method of claim 1, wherein a sidewall oxidation process is performed after the forming of the trench and before the forming of the liner nitride layer such that a sidewall oxidation layer is interposed between the surfaces of the trench and the liner nitride layer.

* * * * *